United States Patent
Yu et al.

(10) Patent No.: US 7,309,897 B2
(45) Date of Patent: Dec. 18, 2007

(54) ELECTROSTATIC DISCHARGE PROTECTOR FOR AN INTEGRATED CIRCUIT

(75) Inventors: Kuo-Feng Yu, Hsinchu (TW); Jian-Hsing Lee, Hsin-Chu (TW); Juing-Yi Wu, Hsinchu (TW); Chong-Gim Gan, Changhua County (TW); Dun-Nian Yaung, Taipei (TW)

(73) Assignee: Taiwan Semiconductor Manuafacturing Company, Ltd., Hsin-Chu (TW)

( * ) Notice: Subject to any disclaimer, the term of this patent is extended or adjusted under 35 U.S.C. 154(b) by 62 days.

(21) Appl. No.: 11/402,907

(22) Filed: Apr. 13, 2006

(65) Prior Publication Data

US 2007/0241406 A1  Oct. 18, 2007

(51) Int. Cl.
*H01L 23/62* (2006.01)
(52) U.S. Cl. ........................... 257/355; 257/361
(58) Field of Classification Search ................ 257/356, 257/357, 358, 359, 360, 361
See application file for complete search history.

(56) References Cited

U.S. PATENT DOCUMENTS

| | | | |
|---|---|---|---|
| 6,147,538 A | 11/2000 | Andresen et al. | |
| 6,310,379 B1 | 10/2001 | Andresen et al. | |
| 6,479,872 B1 * | 11/2002 | Cheng et al. | ............. 257/360 |
| 6,541,824 B2 | 4/2003 | Lee et al. | |
| 6,552,372 B2 | 4/2003 | Wu et al. | |
| 6,576,958 B2 | 6/2003 | Ker et al. | |
| 6,815,776 B2 | 11/2004 | Lee et al. | |
| 6,833,568 B2 | 12/2004 | Duvvury et al. | |
| 6,864,536 B2 | 3/2005 | Lin et al. | |
| 6,876,041 B2 | 4/2005 | Lee et al. | |
| 6,888,248 B2 | 5/2005 | Chen et al. | |
| 6,987,300 B2 * | 1/2006 | Yach et al. | ............. 257/361 |
| 2004/0007742 A1 | 1/2004 | Cheng et al. | |
| 2004/0155292 A1 | 8/2004 | Hung et al. | |
| 2004/0155293 A1 | 8/2004 | Hung et al. | |

* cited by examiner

*Primary Examiner*—Zandra V. Smith
*Assistant Examiner*—Paul E Patton
(74) *Attorney, Agent, or Firm*—Finnegan, Henderson, Farabow, Garrett & Dunner LLP (57) ABSTRACT

An integrated circuit has functional circuitry coupled to a terminal. An electrostatic discharge protector can be coupled to the terminal to protect the functional circuitry from an electrostatic discharge. A substrate includes a first semiconductor material with a first dopant type. A plurality of drain segments adjoin the substrate. Each of the drain segments has a first conductor, a second conductor, and a third conductor. A central via set in a central region of the drain segment couples the second conductor to the third conductor. A peripheral via set in a peripheral region of the drain segment couples the first conductor to the second conductor. A plurality of source segments adjoin the substrate and laterally interlace with the drain segments. If an electrostatic discharge is detected at the terminal of the integrated circuit, an electrical current of the ESD is directed into the electrostatic discharge protector and distributed substantially uniformly among a plurality of resistive paths in the electrostatic discharge protector.

17 Claims, 6 Drawing Sheets

ELECTROSTATIC DISCHARGE PROTECTOR FOR AN INTEGRATED CIRCUIT

TECHNICAL FIELD

This invention generally relates to protecting integrated circuits from electrostatic discharge.

BACKGROUND

Integrated circuits (ICs) are susceptible to damage by electrostatic discharge (ESD). For example, a metal-oxide-semiconductor field effect transistor (MOSFET) in an IC may have two functional elements that are separated by an epitaxial layer between the elements. An ESD current that enters one of the elements can permanently damage the epitaxial layer such that the MOSFET is no longer functional.

Figure 1:
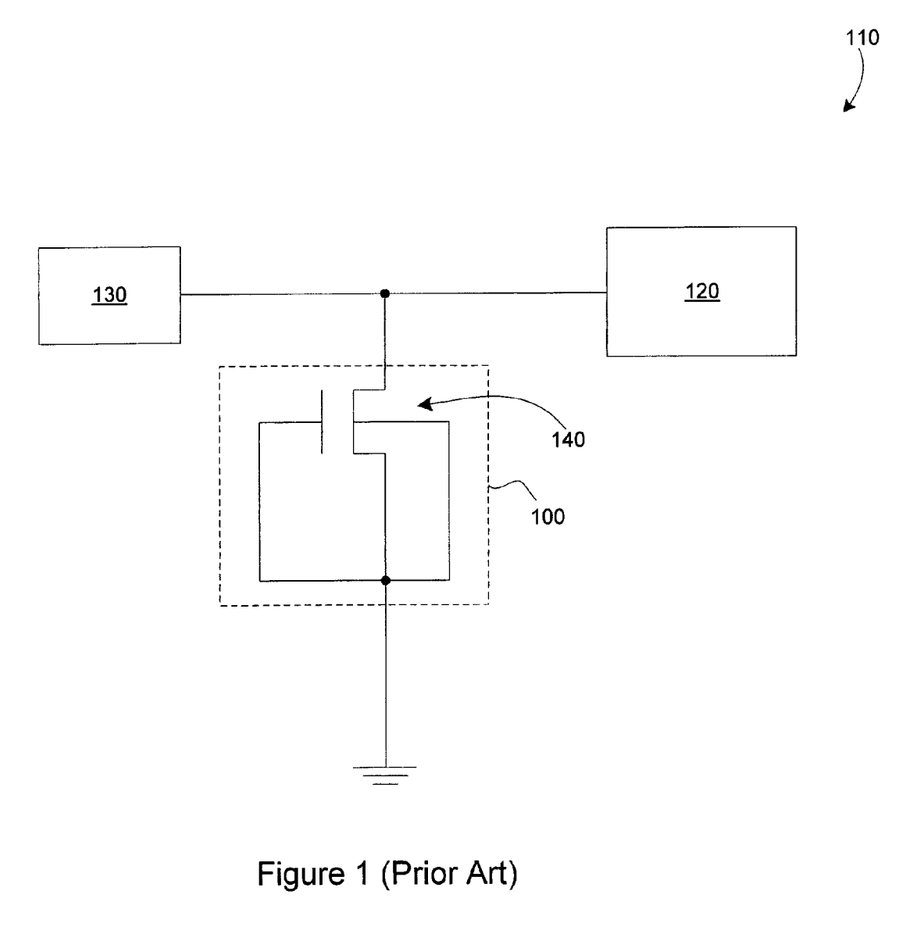
FIG. 1 is a schematic diagram of a conventional integrated circuit with an ESD protector, the ESD protector including a MOSFET.
Figure 2:
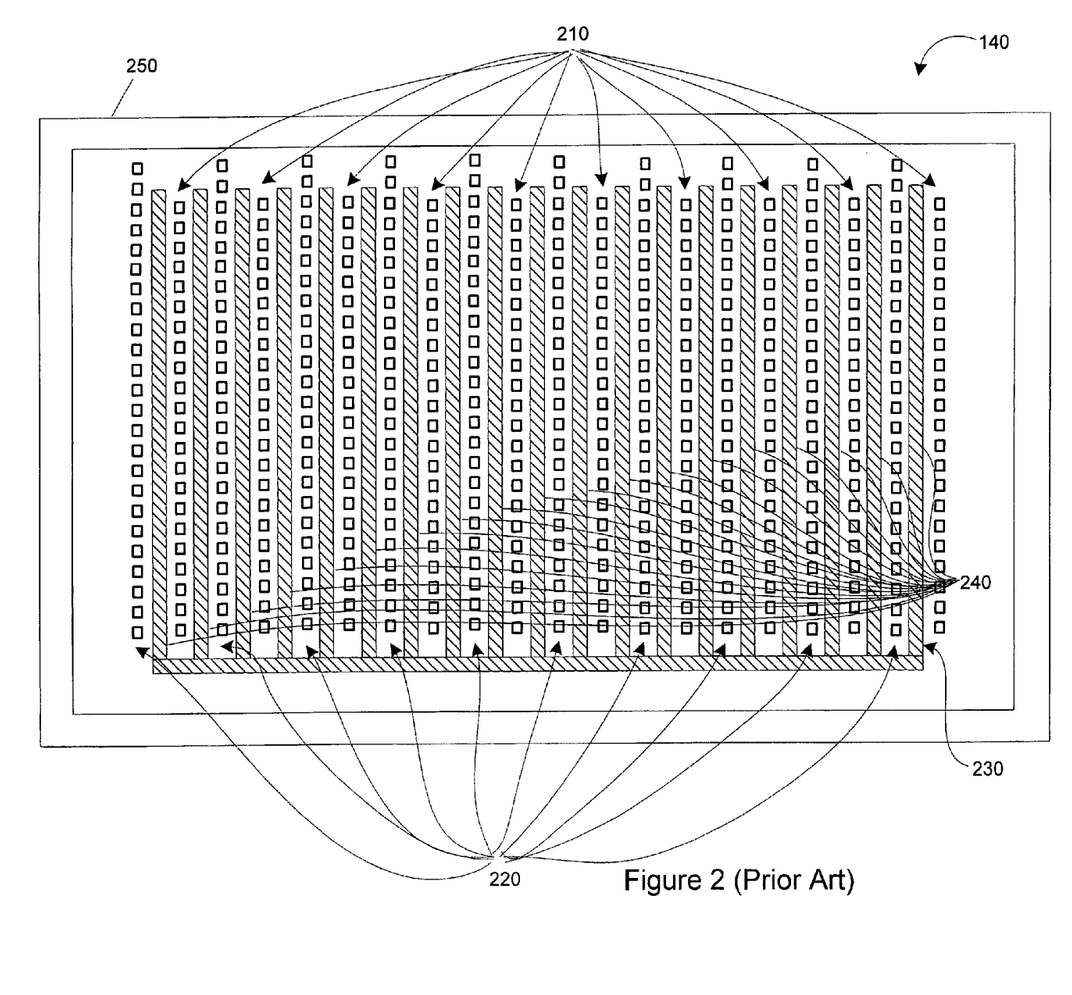
FIG. 2 is a cross-sectional top view of the FET in FIG. 1.

FIG. 1 is a schematic diagram of a conventional IC with an ESD protector. With reference to FIG. 1, an ESD protector 100 is implemented in an IC 110 to divert ESD current from functional circuitry 120 of the IC 110 and thereby protect the functional circuitry 120. For example, the ESD protector 100 may be connected in parallel with the functional circuitry 120 to an input or output pad 130 of the IC 110. The ESD protector 100 comprises a specialized MOSFET 140. FIG. 2 illustrates a cross-sectional top view of the MOSFET 140. With reference to FIG. 2, the MOSFET 140 includes multiple drain fingers 210 and multiple source fingers 220 interlaced with the drain fingers 210. The drain fingers 210 and source fingers 220 are typically disposed underneath the cross-sectional plane of the view, and are therefore not visible in FIG. 1. The drain fingers 210 and the source fingers 220 are embedded in a semiconductor base (not seen) at lateral locations that are indicated by arrows drawn from the reference numbers. The MOSFET 140 also has a gate 230 comprising gate fingers 240 disposed between the drain fingers 210 and the source fingers 220. The source fingers 220, semiconductor base, and gate 230 are electrically grounded. The semiconductor base may be electrically coupled to ground via a guard ring 250.

The ESD current is conducted into the multiple drain fingers 210 to distribute the current among the individual drain fingers 210. When a voltage at the drain fingers 210 reaches a threshold value, the drain fingers 210 conduct into the semiconductor base. The drain fingers 210, source fingers 220, and semiconductor base begin to operate as a collector, emitter, and base, respectively, of a bipolar junction transistor (BJT), conducting the ESD current through the semiconductor base and into the source fingers 220. Finally, the ESD current is sunk to electrical ground.

However, the ESD current typically flows into the drain fingers 210 non-uniformly, causing a subset of the drain fingers 210 to fail. Because there are inherent variations in the resistances of the individual drain fingers 210, the ESD current concentrates in a subset of the drain fingers 210 that present the lowest resistance to the ESD current. For example, the ESD current may concentrate in a single drain finger 210. This current concentration breaks down the subset of the drain fingers 210 and permanently damages the MOSFET 140, typically rendering the IC 110 unusable thereafter.

Furthermore, there is a need for thinner epitaxial layers used in ICs, such as epitaxial N+ doped or P+ doped layers in MOSFETs, to be made thinner as ICs are manufactured to be smaller. However, ICs tend to have a voltage tolerance that is highly sensitive to epitaxial layer thickness. For a decreased epitaxial thickness, an IC incorporating the thinner epitaxial layer may be damaged by a significantly smaller electrostatic discharge.

Thus, it is desirable to provide an ESD protector for an integrated circuit to protect the integrated circuit from larger electrostatic discharges. It is further desirable for the ESD protector to protect the integrated circuit at decreased epitaxial layer thicknesses.

SUMMARY

An electrostatic discharge protector is provided for an integrated circuit, wherein the integrated circuit has a terminal. The electrostatic discharge protector comprises a substrate comprising a first semiconductor material with a first dopant type. A plurality of drain segments adjoin the substrate, each of the drain segments having a central region and a peripheral region. Each of the drain segments comprises a diffusion element comprising a second semiconductor material with a second dopant type, the second dopant type being different from the first dopant type. A connector is adapted to couple the diffusion element to the terminal. The connector comprises a first conductor, a second conductor, and a third conductor. A central via set in the central region of the drain segment couples the second conductor to the third conductor. A peripheral via set in the peripheral region of the drain segment couples the first conductor to the second conductor. A plurality of source segments adjoin the substrate and laterally interlace with the drain segments. The source segments comprise a third semiconductor material with the second dopant type.

An integrated circuit comprises functional circuitry coupled to a terminal and an electrostatic discharge protector coupled to the terminal and adapted to protect the functional circuitry from an electrostatic discharge at the terminal. The electrostatic discharge protector comprises a substrate comprising a first semiconductor material with a first dopant type. A plurality of drain segments adjoin the substrate, each of the drain segments having a central region and a peripheral region. Each of the drain segments comprises a diffusion element comprising a second semiconductor material with a second dopant type, the second dopant type being different from the first dopant type. A connector is adapted to couple the diffusion element to the terminal. The connector comprises a first conductor, a second conductor, and a third conductor. A central via set in the central region of the drain segment couples the second conductor to the third conductor. A peripheral via set in the peripheral region of the drain segment couples the first conductor to the second conductor. A plurality of source segments adjoin the substrate and laterally interlace with the drain segments. The source segments comprise a third semiconductor material with the second dopant type.

A method of protecting an integrated circuit from an electrostatic discharge, wherein the integrated circuit comprises an electrostatic discharge protector and functional circuitry, comprises receiving an electrical current at a terminal of the integrated circuit. The presence of an electrostatic discharge on the terminal is detected. If the electrostatic discharge is not detected, the electrical current is directed to the functional circuitry of the integrated circuitry. If the electrostatic discharge is detected, the electrical current is directed into the electrostatic discharge protector and the electrical current is distributed among a plurality of resistive paths in the electrostatic discharge protector. The electrical current is directed in at least one first direction, in a second direction, and in a third direction that is substantially opposite to the first direction.

BRIEF DESCRIPTION OF THE DRAWINGS

The accompanying drawings, which are incorporated in and constitute a part of this specification, illustrate embodiments of the invention and, together with the description, serve to explain advantages and principles of the invention.

In the drawings.

DESCRIPTION OF THE EMBODIMENTS

Reference will now be made in detail to embodiments of the invention, examples of which are illustrated in the accompanying drawings. Wherever possible, the same reference numbers will be used throughout the drawings to refer to the same or like parts.

An integrated circuit (IC) (not shown) comprises functional circuitry having a plurality of electronic components and electrical connections between the electronic components. The electronic components typically comprise active and passive electronic components. For example, the IC may comprise resistors, capacitors, and/or field effect transistors (FETs). The IC may use very large scale integration (VLSI) or ultra large scale integration (ULSI), indicating the degree of spatial density of transistors in a single IC. Typically, the IC is incorporated into a monolith, such as a semiconductor "chip."

Figure 3:
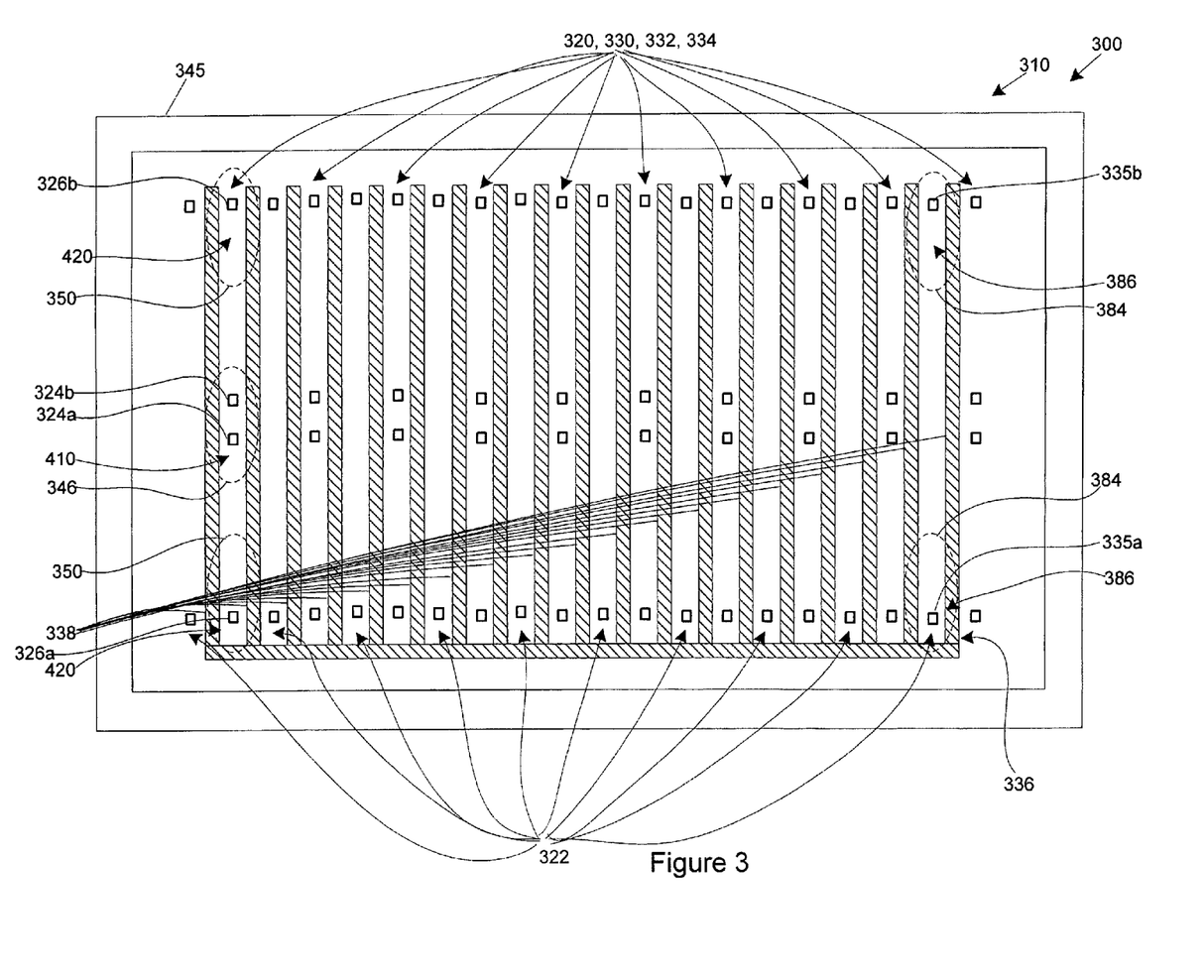
FIG. 3 is a cross-sectional top view of an exemplary embodiment of a transistor in an ESD protector.

FIG. 3 is a cross-sectional top view of an exemplary embodiment of a transistor in an ESD protector, consistent with the present invention. With reference to FIG. 3, one or more electrostatic discharge (ESD) protectors 300 are provided to protect the functional circuitry of an IC (not shown) from an electrostatic discharge of current into the IC. The ESD protector 300 of FIG. 3 is provided only to illustrate the invention, and should not be used to limit the scope of the invention or its equivalents to the exemplary embodiments provided herein. An ESD may emanate from a human body, a tool, or another body capable of accumulating a positive or negative charge. The ESD is received at a terminal of the IC, such as an input or output pad or at another region of the IC. The ESD protector 300 is typically incorporated into the monolith of the IC. For example, the ESD protector 300 may be implemented near one of the input or output pads of the IC to protect the IC from an ESD that could be introduced at that input or output pad.

The ESD protector 300 detects the presence of an ESD capable of endangering the functional circuitry of the IC. The ESD protector 300 is coupled to the terminal of the IC, such as in parallel with the functional circuitry, to detect whether a voltage level at the terminal threatens the functional circuitry. If the presence of the ESD is not detected, the ESD protector 300 allows current on the terminal to pass to the functional circuitry. However, if the ESD is detected, the ESD protector 300 directs the ESD current away from the functional circuitry and into the ESD protector 300. Thus, the ESD protector 300 is capable of protecting the IC from the ESD substantially without interfering with the functionality of the IC.

The ESD protector 300 comprises a transistor 310 adapted to detect the presence of the ESD on the terminal, turn on when the ESD is detected, and sink the ESD current, such as to electrical ground. In one version, the transistor 310 is a FET. For example, the transistor 310 may be a MOSFET or junction field effect transistor (JFET). In one embodiment, the transistor 310 is a grounded gate n-type metal-oxide-semiconductor (GG-NMOS) FET. The GG-NMOS FET comprises a gate, a source, a drain, and a substrate. The gate, source, and substrate of the GG-NMOS FET are connected to electrical ground. In alternative versions, the transistor 310 can be a grounded gate p-type metal-oxide-semiconductor (GG-PMOS) FET, a bipolar junction transistor (BJT), or another type of transistor.

The transistor 310 comprises a plurality of drain segments 320 and a plurality of source segments 322 laterally interlaced with the drain segments 320. Vias 324a,b, 326a,b are provided in the drain segments 320 to electrically couple the drain segments 320 to the IC terminal through a first conductor 330, a second conductor 332, and a third conductor 334. Vias 335a,b may also be provided in the source segments 322 to allow an electrical coupling to the source segments 322. In addition, the transistor 310 may comprise a gate 336 having gate fingers 338. The cross-sectional plane of the view in FIG. 3 traverses the gate 336 with its gate fingers 338, so the structures of the gate 336 and the gate fingers 338 are visible in FIG. 3. The drain segments 320, including the first, second, and third conductors 330, 332, 334, and the source segments 322 are typically disposed underneath the cross-sectional plane of the view in FIG. 3, and are therefore not visible in the cross-sectional view of FIG. 3. The vias 324a,b, 326a,b, and 335a,b of the transistor 310 are also typically underneath this cross-sectional plane. However, the vias 324a,b, 326a,b, 335a,b are intentionally shown in FIG. 3 to illustrate the lateral locations of the vias 324a,b, 326a,b, 335a,b.

Figure 4:
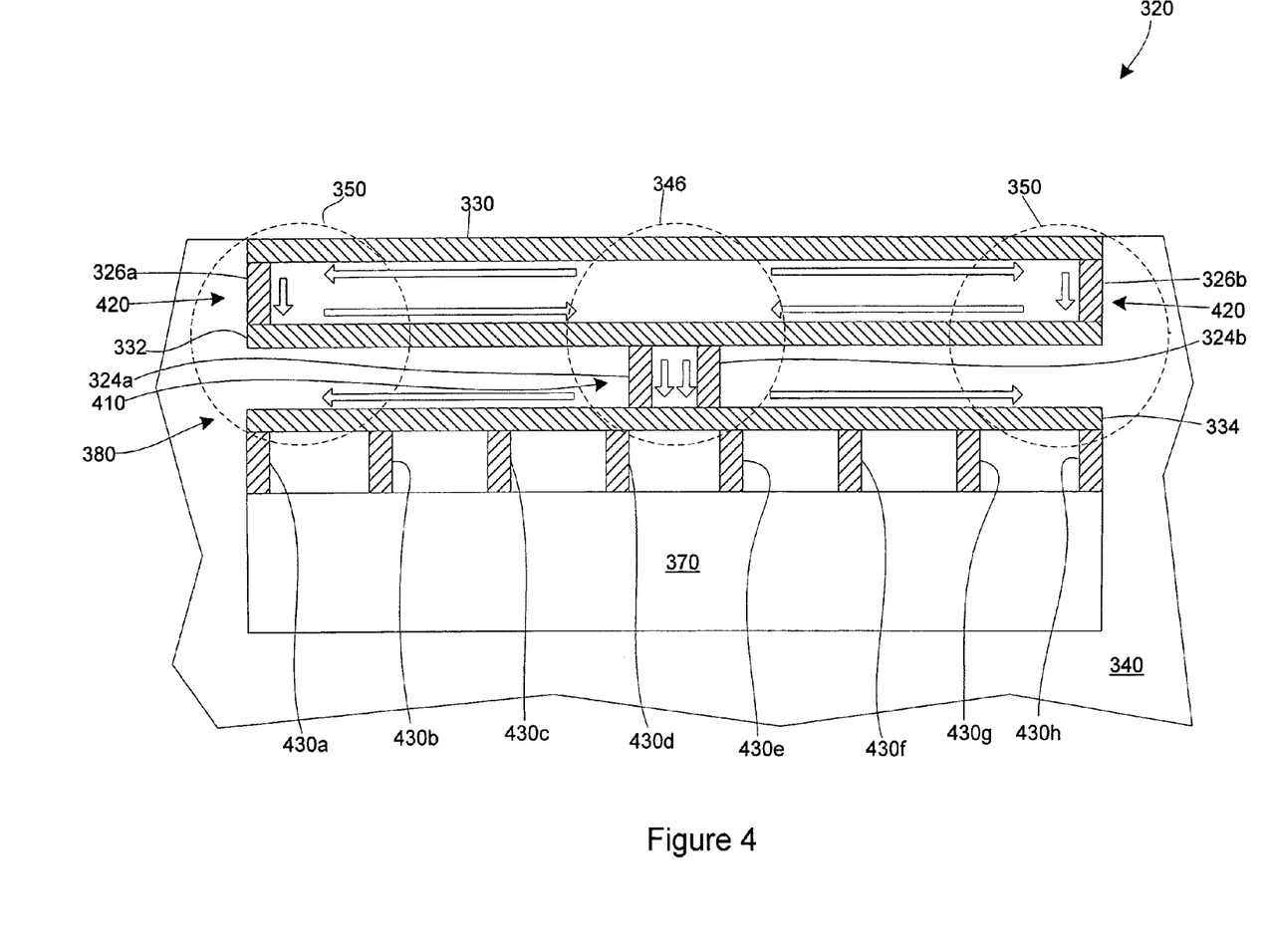
FIG. 4 is a cross-sectional side view of an exemplary embodiment of a drain segment in the transistor of FIG. 3.

FIG. 4 is a cross-sectional side view (not to scale) of an exemplary embodiment of one of the drain segments 320 as viewed from the right side of FIG. 3. The drain segments 320 adjoin a substrate 340 of the transistor 310 at a top surface of the substrate 340, such as by being embedded in the substrate 340 (as shown). The substrate 340 includes a first semiconductor material doped with an impurity of a first dopant type. The first dopant type may be an electron acceptor type (p-type) or electron donor type (n-type). The electron acceptor type (p-type) dopant may include, for example, boron. The electron donor type (n-type) dopant may include, for example, phosphorous, arsenic, or antimony. In one embodiment, the first semiconductor material comprises p-type boron-doped silicon. The substrate 340 may be coupled to electrical ground via a guard ring 345 (FIG. 3).

Each of the drain segments 320 has a central region 346 and at least one peripheral region 350. The drain segments 320 are electrically coupled in parallel to form a resistive network. In one version, the drain segments 320 are shaped as elongated fingers. Each drain segment 320 has the peripheral regions 350 located at the lengthwise opposing ends of the elongated finger. The drain segments 320 are configured to be approximately parallel and spaced apart from one another along the substrate 340. For example, the drain segments 320 may be uniformly spaced apart along a direction that is approximately perpendicular to the lengths of the drain segments 320.

Each of the drain segments 320 comprises a diffusion element 370 and a connector 380 adapted to electrically couple the terminal of the IC to the diffusion element 370. The first conductor 330, the second conductor 332, and the third conductor 334 are provided in the connector 380, as shown in FIG. 4. For example, the first, second, and third conductors 330, 332, 334 may extend lengthwise along the drain segment 320. The first, second, and third conductors 330, 332, 334 comprise one or more electrically conductive materials, such as metal. The diffusion element 370 comprises a second semiconductor material having a second dopant type that is different from the first dopant type of the first semiconductor material. For example, the first dopant type may be electron acceptor type ("p-type") while the second dopant type is electron donor type ("n-type"), or vice versa. If the transistor 310 is an NMOS FET, the first dopant type is p-type and the second dopant type is n-type.

Referring again to FIG. 3, the source segments 322 adjoin the substrate 340 and laterally interlace with the drain segments 320. For example, the source segments 322 may be embedded in the substrate 340. The source segments 322 comprise a third semiconductor material having the second dopant type of the second semiconductor material of the drain segments 320. For example, the third semiconductor material may have substantially the same composition as the second semiconductor material. Each of the source segments 322 may have one or more peripheral regions 384. For example, the source segments 322 may also be shaped as elongated fingers.

In one version, each of the source segments 322 comprises one or more source via sets 386, each source via set 386 comprising one or more of the vias 335*a,b*. In one embodiment, as shown in FIG. 3, the source segment 322 has two peripheral regions 384 and a source via set 386 is provided at each of the peripheral regions 384.

The first and second dopant types may be selected in relation to the polarity of a nominal voltage that is expected to be applied to the functional circuitry via the IC terminal during normal operation. For example, if the nominal voltage is positive, the first dopant type of the first semiconductor material may be selected to be p-type. The second dopant type of the second semiconductor material would therefore be n-type. Alternatively, if the nominal voltage is negative; the first dopant type may be selected to be n-type and the second dopant type may be selected to be p-type. The appropriate selection of dopant type based on expected nominal voltage polarity ensures that the transistor 310 does not turn on to sink the current on the terminal until the ESD is detected.

The gate 336 of the transistor 310 has the gate fingers 338 extending vertically above, and laterally between, the drain segments 320 and the source segments 322. The gate fingers 338 may be electrically coupled in parallel. The gate fingers 338 comprise an electrically conductive material, such as metal or polysilicon.

The connector 380 of each of the drain segments 320 further comprises a central via set 410 in the central region 346 of the drain segment 320 and a peripheral via set 420 in each of at least one of the peripheral regions 350 of the drain segment 320. The central via set 410 comprises one or more of the vias 324*a,b* and the peripheral via set 420 also comprises one or more of the vias 326*a,b*. The vias 324*a,b*, 326*a,b* are electrically conductive couplers that are adapted to pass through a non-conductor to electrically couple two conductors on either side of the non-conductor. For example, the vias 324*a,b*, 326*a,b* may extend through a dielectric layer to connect two metal layers on either side of the dielectric layer.

As illustrated in the example of FIG. 4, the second conductor 332 extends from the central via set 410 to each of the peripheral via sets 420 to electrically couple the central via set 410 to the peripheral via sets 420. For example, the second conductor 332 may extend lengthwise along the drain segment 320 between the central and peripheral via sets 410, 420 within the drain segment 320, such as shown in FIG. 4. Thus, an electrical current that is applied to the connector 380 of the drain segment 320 at the first conductor 330 will traverse the peripheral via set 420, the second conductor 332, and the central via set 410 in series along a circuitous resistive path before reaching the diffusion element 370, such as shown by the hollow arrows in FIG. 4.

The central and peripheral via sets 410, 420 are configured in relation to the drain segment 320 to achieve a preselected electrical resistance in each of the individual drain segments 320. When either the central via set 410 or the peripheral via set 420 comprises a plurality of vias, the vias of that particular via set 410 or 420 are laterally spaced closer to each other than to the vias of the other via set 420 or 410, respectively, such that the plurality of vias of the particular via set 410 or 420 form a cluster. For example, in the embodiment of FIGS. 3 and 4, the central via set 410 comprises two vias 324*a,b* that are spaced closer to each other than they are from the vias 326*a,b* of the peripheral via set 420. If the central via set 410 or the peripheral via set 420 comprises such a cluster of a plurality of vias 324*a,b*, the vias 324*a,b*, 326*a,b* in their entirety are non-uniformly spaced laterally along the length of the drain segment 320. In one embodiment, the central via set 410 is spaced apart from the peripheral via set 420, measured between the vias 324*a* and 326*a* in each via set 410, 420 that is nearest to the other via set 410, 420, by a spacing distance such that a ratio of the spacing distance to the length of the drain segment 320 is at least about $1 \times 10^{-6}$.

The connector 380 can also comprise a set of one or more extension vias 430*a-h* to connect the third conductor 334 of the connector 380 to the diffusion element 370. For example, the connector 380 may comprise the 8 extension vias 430*a-h* shown in FIG. 4. The extension vias 430*a-h* can be arranged along the third conductor 334 to further increase the resistance of the current path from the first conductor 330 to the diffusion element 370.

An electrical current introduced into the connector 380 may be transmitted along multiple circuitous current paths through the first conductor 330, the peripheral via set 420, the second conductor 332, the central via set 410, the third conductor 334, and the extension vias 430*a-h* to reach the diffusion element 370. As the current is passed from the first conductor 330 to the diffusion element 370, the current may be directed in a first direction, after which the current is directed in a second direction. After the second direction, the current is directed in a third direction that is substantially opposite to the first direction, meaning that the third direction forms an angle with the first direction of from about 160 to about 200 degrees. For example, the third direction may be approximately antiparallel to the first direction. These circuitous current paths increase the resistance presented to the current as it passes from the first conductor 330 to the diffusion element 370. In addition, the current may once again be directed in approximately the first direction such that the current traverses a serpentine path.

In one version, the peripheral via sets 420 couple the first conductor 330 to the second conductor 332, while the central via set 410 couples the second conductor 332 to the third conductor 334. For example, the first conductor 330 may be arranged above the second conductor 332 and vertically spaced apart from the second conductor 332, and the third conductor 334 may be below the second conductor 332 and vertically spaced apart from the second conductor 332, as shown in FIG. 4. Thus, an ESD current introduced into the connector 380 will enter the first conductor 330, outwardly traverse the first conductor 330 in a first direction toward the peripheral via set 420, cross the peripheral via set 420 in a second direction, inwardly traverse the second conductor 332 in a third direction that is substantially opposite to the first direction, and cross the central via set 410 into the third conductor 334. Then, the ESD current outwardly distributes among the extension vias 430*a-h* in approximately the first direction and crosses the extension vias 430*a-h* to reach the diffusion element 370. This serpentine current path is illustrated by the hollow arrows in FIG. 4.

Figure 5A:
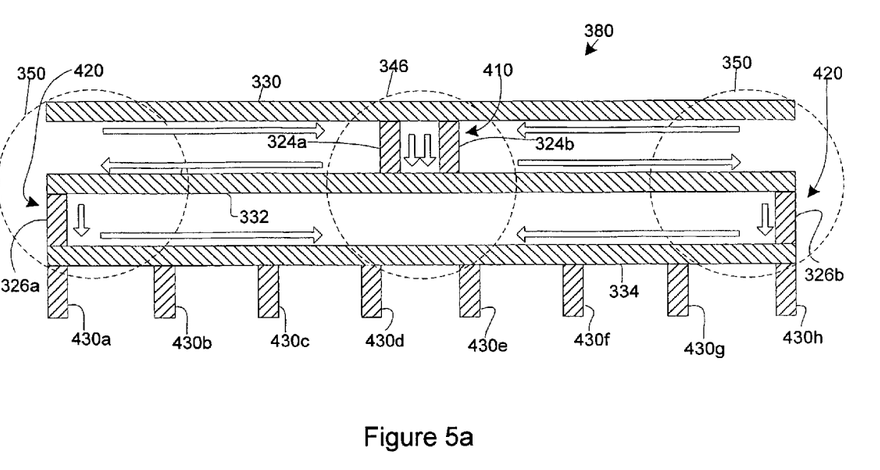
FIGS. 5a and 5b are cross-sectional side views of further exemplary embodiments of connectors for a transistor in an ESD protector.

In an alternative version, illustrated in the exemplary embodiment of FIG. 5*a*, the central via set 410 couples the first conductor 330 to the second conductor 332, while the peripheral via set 420 couples the second conductor 332 to the third conductor 334. For example, the first conductor 330 may be arranged above the third conductor 334. The second conductor 332 can be arranged between the first conductor 330 and the third conductor 334 such that the central via set 410 is provided above the second conductor 332 and the peripheral via set 420 is provided below the second conductor 332. Current applied to the first conductor 330 flows laterally inward to the central via set 410 in a first direction, passes through the central via set 410 in a second direction, and traverses the second conductor 332 laterally outwardly to the peripheral via set 420 in a third direction that is substantially opposite to the first direction, such as illustrated by the hollow arrows in FIG. 5*a*. After passing through the peripheral via set 420, the current may then distribute laterally inward along the third conductor 334 in approximately the first direction to reach the multiple extension vias 430*a-h*.

Figure 5B:
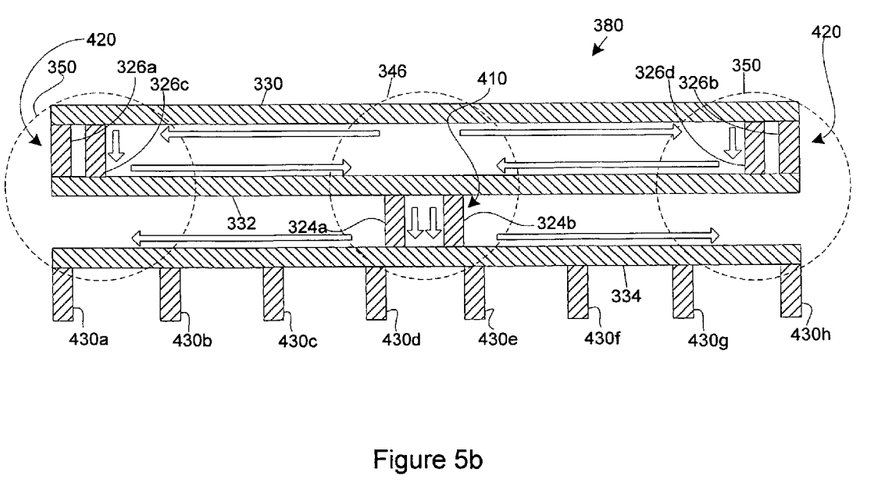

In another embodiment, illustrated in the exemplary embodiment of FIG. 5*b*, each of the peripheral via sets 420 comprises two vias 326*a-d*. The central via set 410 is provided below the second conductor 332 while the peripheral via set 420 is provided above the second conductor 332. If the first conductor 330 is provided above the third conductor 334 (as shown), current applied to the first conductor 330 flows laterally outward to the peripheral via set 420 in a first direction, through the peripheral via set 420 in a second direction, and laterally inward to the central via set 410 in a third direction that is substantially opposite to the first direction, such as illustrated by the hollow arrows in FIG. 5*b*. After crossing the central via set 410 to the third conductor 334, the current may then distribute laterally outward along the third conductor 334 in approximately the first direction to reach the multiple extension vias 430*a-h*.

Figure 6:
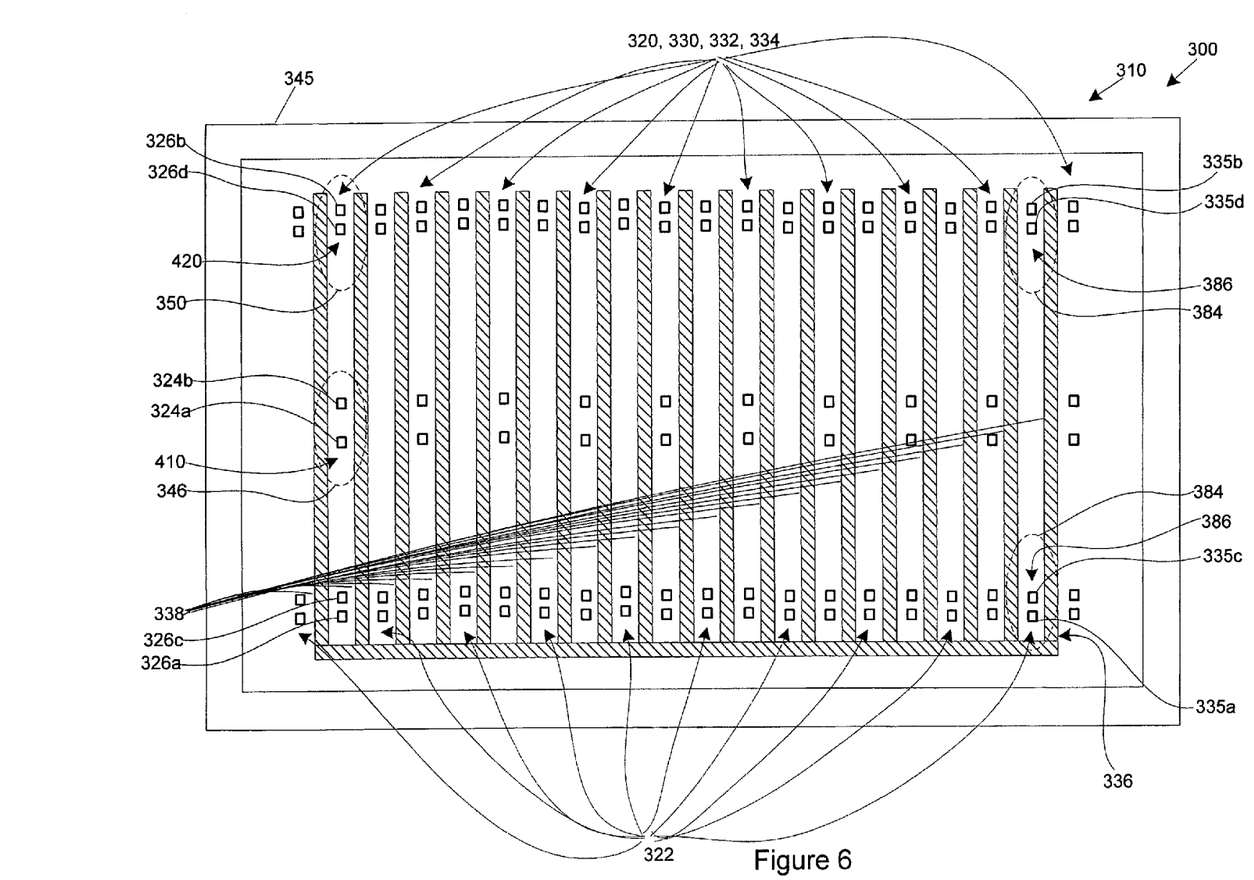
FIG. 6 is a cross-sectional top view of another exemplary embodiment of a transistor in an ESD protector, the transistor having drain segments, and each of the drain segments having the connector of FIG. 5b.

FIG. 6 is a cross-sectional top view of an exemplary embodiment of the transistor 310 comprising the connector 380 of FIG. 5*b*. As in FIG. 3, the vias 324*a,b*, 326*a-d*, 335*a-d* are intentionally made visible to show their lateral arrangement, although the vias 324*a,b*, 326*a-d*, 335*a-d* are typically underneath the plane of the cross-sectional view. Each of the peripheral via sets 420 of the drain segment 320 comprises two vias 326*a,c*, 326*b,d* in this embodiment. In addition, the source via sets 386 in each of the source segments 322 comprise two vias 335*a,c*, 335*b,d* in each of the peripheral regions 384 of the source segment 322.

The central and peripheral via sets 410, 420 are arranged in relation to the drain segment 320 such that the transistor 310 has a desirable ratio of a resistance of each of the individual drain segments 320 to a resistance of the entire ESD protector 300. When the ESD current enters the transistor 310, the ESD current is distributed approximately uniformly among the multiple drain segments 320 to improve the tolerance of the ESD protector 300 to the ESD current. In one embodiment, the electrical current applied to the drain segment 320 traverses a resistance within each of the drain segments 320 of at least about $1\times10^{-10}\Omega$.

Furthermore, the vias 324*a,b*, 326*a-d* of the central and peripheral via sets 410, 420 in the drain segments 320 may be shaped and sized to achieve the preselected resistance in each of the individual drain segments 320. For example, the vias 324*a,b*, 326*a-d* may be sized to have a sufficiently small diameter to desirably increase the electrical resistance of the connectors 380. However, the vias 324*a,b*, 326*a-d* may also be sized to have a diameter sufficiently large to allow the transmission of a desired amount of electrical current therethrough. In one embodiment, the vias 324*a,b*, 326*a-d* have a diameter of from about $1\times10^{-6}$ to about $1\times10^{6}$ μm.

In operation, the ESD may have a voltage that is of the same or opposite polarity as the nominal voltage that is expected to be applied to the ESD. An ESD having the same voltage polarity as the nominal voltage is typically dissipated by the transistor 310 in a "forward active mode," wherein the base-emitter junction is forward biased and the base-collector junction is reverse-biased. An ESD having a polarity opposite that of the nominal voltage is typically dissipated by the transistor 310 in a "reverse active mode," wherein the base-emitter junction is reverse-biased and the base-collector junction is forward-biased.

If the transistor 310 is constructed to have a first dopant type that is p-type and a second dopant type that is n-type, the drain segments 320, the source segments 322, and the substrate 340 of the transistor 310 emulate an NPN bipolar junction transistor (BJT). The drain segments 320 behave as a collector, the source segments 322 behave as an emitter, and the substrate 340 behaves as a base. A positive ESD voltage applied to the drain segments 320 reverse biases the effective collector-base junction. When the collector voltage reaches a positive threshold voltage $V_t$, a limited amount of leakage current passes from the diffusion elements 370 of the drain segments 320 to the substrate 340. Because the substrate 340 has a latent resistance that is traversed by this current, a positive voltage develops at the substrate 340. The positive substrate voltage activates the transistor 310, causing the voltage drop between the drain segments 320 and the source segments 322 to decrease to a "snapback" voltage $V_s$ as current flows from the drain segments 320 to the source segments 322.

If the transistor 310 is constructed to have a first dopant type that is n-type and a second dopant type that is p-type, when a negative ESD voltage is applied to the drain segments 320, the current flows between the drain segments 320 and the source segments 322 in the opposite direction than that described above. As a result, the drain segments 320, the source segments 322, and the substrate 340 of the transistor 310 emulate a PNP BJT. The negative ESD voltage reverse biases the collector-base junction. When the collector voltage reaches a negative threshold voltage $V_t$, a limited amount of leakage current passes from the substrate 340 to the diffusion elements 370 of the drain segments 320.

Because of the latent resistance of the substrate 340, a negative voltage develops at the substrate 340. The negative substrate voltage activates the transistor 310, causing the voltage drop between the source segments 322 and the drain segments 320 to decrease to the "snapback" voltage $V_s$ as current flows from the source segments 322 to the drain segments 320.

In the conventional ESD protector 100, such as shown in FIG. 2, the ESD current finds a path of least resistance through a subset of the drain fingers 210 of the MOSFET 140. Although the ESD protector 100 in its entirety may present a sufficient resistance to the ESD current, much of that resistance is presented by the semiconductor base of the MOSFET 140 rather than by the individual drain fingers 210. Although the variations in resistance between the individual drain fingers 210 are small, these variations are large in proportion to the resistance of each of the individual drain fingers 210. Thus, the current concentrates in the path of least resistance and breaks down the MOSFET 140 along this path. For example, the current may focus into a path of least resistance through a single drain finger 210 and damage this particular drain finger 210, effectively disabling the entire MOSFET 140.

In contrast, the transistor 310 comprising the central via set 410 and the peripheral via set 420 more uniformly distributes the current among the plurality of drain segments 320. By increasing the resistance of each drain segment 320, the variations in resistance between the individual drain segments 320 become less significant in proportion to the resistance of each of the drain segments 320. Thus, by more uniformly distributing the current, the ESD protector 300 achieves a higher tolerance to electrostatic discharge than the conventional MOSFET 140.

Furthermore, the ESD protector 300 has a reduced sensitivity between ESD breakdown voltage and the thickness of an epitaxial layer (not shown) present between two elements in the functional circuitry of the IC, as shown by the exemplary data of Table 1 below. The epitaxial layer may be a p-doped or n-doped layer, such as an epitaxial layer that serves as a source or a drain of a MOSFET. As the thickness of the epitaxial layer is reduced, the effective resistance of the substrate is typically also reduced, leading to decreased tolerance to ESD. However, for decreased epitaxial layer thicknesses, such as less than about 4.5 μm, an integrated circuit that is coupled to the ESD protector 300 has improved tolerance to voltages produced by ESD compared with when the integrated circuit is coupled to the conventional MOSFET 140.

TABLE 1

Conventional and New Breakdown Voltages vs. Epitaxial Layer Thickness

| Epitaxial Layer Thickness (μm) | Conventional (kV) | New (kV) |
| --- | --- | --- |
| 3.5 | 2.0 | 4.5 |
| 4.0 | 2.75 | 5.0 |
| 4.5 | 5.5 | 5.5 |
| 7.0 | 6.0 | 6.0 |

Although embodiments consistent with the present invention have been described in considerable detail with regard to embodiments thereof, other versions are possible. For example, the drain segments 320 or the source segments 322 may comprise other electronic structures equivalent in function to the illustrative structures herein. Furthermore, relative or positional terms, such as "first," "second," and "third," or "vertically" and "laterally," are used with respect to the exemplary embodiments and are interchangeable. Therefore, the appended claims should not be limited to the description of the versions contained herein.

What is claimed is:

1. An electrostatic discharge protector for an integrated circuit, wherein the integrated circuit has a terminal, the electrostatic discharge protector comprising:
    a substrate comprising a first semiconductor material with a first dopant type;
    a plurality of drain segments adjoining a top surface of the substrate, each of the drain segments having a central region and a peripheral region, and each of the drain segments comprising:
        (a) a diffusion element comprising a second semiconductor material with a second dopant type, the second dopant type being different from the first dopant type, and
        (b) a connector adapted to couple the diffusion element to the terminal, the connector comprising:
            (i) a first conductor,
            (ii) a second conductor,
            (iii) a third conductor,
            (iv) a central via set in the central region of the drain segment to couple the second conductor to the third conductor, and
            (v) a peripheral via set in the peripheral region of the drain segment to couple the first conductor to the second conductor; and
    a plurality of source segments adjoining the substrate and laterally interlaced with the drain segments, the source segments comprising a third semiconductor material with the second dopant type.

2. An electrostatic discharge protector according to claim 1, wherein the first conductor is above the third conductor.

3. An electrostatic discharge protector according to claim 1, wherein the first conductor is below the third conductor.

4. An electrostatic discharge protector according to claim 1, wherein one or both of the central via set and the peripheral via set comprise a plurality of vias.

5. An electrostatic discharge protector according to claim 1, wherein the first semiconductor material has a p-type dopant, and the second and third semiconductor materials have n-type dopants.

6. An electrostatic discharge protector according to claim 1, wherein each of the source segments comprises at least one via in a peripheral region of the source segment.

7. An electrostatic discharge protector according to claim 1, wherein the second semiconductor material has substantially the same composition as the third semiconductor material.

8. An electrostatic discharge protector according to claim 1, wherein each of the electrically resistive paths has an electrical resistance of at least about $1 \times 10^{-10}$ Ohms.

9. An electrostatic discharge protector according to claim 1, further comprising a gate that comprises gate fingers extending vertically above, and laterally between, the drain segments and the source segments.

10. An integrated circuit comprising:
    functional circuitry coupled to a terminal; and
    an electrostatic discharge protector coupled to the terminal and adapted to protect the functional circuitry from an electrostatic discharge at the terminal, the electrostatic discharge protector comprising:
        a substrate comprising a first semiconductor material with a first dopant type, a plurality of drain segments adjoining a top surface of the substrate, each of the drain segments having a central region and a peripheral region, and each of the drain segments comprising:
(a) a diffusion element comprising a second semiconductor material with a second dopant type, the second dopant type being different from the first dopant type, and
(b) a connector adapted to couple the diffusion element to the terminal, the connector comprising:
  (i) a first conductor,
  (ii) a second conductor,
  (iii) a third conductor,
  (iv) a central via set in the central region to couple the second conductor to the third conductor, and
  (v) a peripheral via set in the peripheral region to couple the first conductor to the second conductor; and
a plurality of source segments adjoining the substrate and laterally interlaced with the drain segments, the source segments comprising a third semiconductor material with the second dopant type.

11. An integrated circuit according to claim 10, wherein the first conductor is above the third conductor.

12. An integrated circuit according to claim 10, wherein the first conductor is below the third conductor.

13. An integrated circuit according to claim 10, wherein one or both of the central via set and the peripheral via set comprise a plurality of vias.

14. An integrated circuit according to claim 10, wherein the first semiconductor material has a p-type dopant, and the second and third semiconductor materials have n-type dopants.

15. An integrated circuit according to claim 10, wherein each of the source segments comprises at least one via in a peripheral region of the source segment.

16. An integrated circuit according to claim 10, wherein the second semiconductor material has substantially the same composition as the third semiconductor material.

17. An integrated circuit according to claim 10, wherein each of the electrically resistive paths has an electrical resistance of at least about $1 \times 10^{-10}$ Ohms.

* * * * *